(12) United States Patent
Kim et al.

(10) Patent No.: US 8,461,904 B2
(45) Date of Patent: Jun. 11, 2013

(54) SWITCHING DEVICE AND SEMICONDUCTOR INTEGRATED CIRCUIT DEVICE INCLUDING THE SAME

(75) Inventors: Tak-Yung Kim, Seoul (KR); Taewhan Kim, Seoul (KR)

(73) Assignees: Samsung Electronics Co., Ltd., Suwon-si, Gyeonggi-do (KR); SNU R&DB Foundation, Seoul (KR)

(*) Notice: Subject to any disclaimer, the term of this patent is extended or adjusted under 35 U.S.C. 154(b) by 130 days.

(21) Appl. No.: 13/071,093

(22) Filed: Mar. 24, 2011

(65) Prior Publication Data
US 2011/0234285 A1 Sep. 29, 2011

(30) Foreign Application Priority Data
Mar. 24, 2010 (KR) .................. 10-2010-0026429

(51) Int. Cl.
*H03B 1/00* (2006.01)
*H03K 3/00* (2006.01)

(52) U.S. Cl.
USPC ......................................... 327/427; 327/112

(58) Field of Classification Search
USPC ................. 327/108–112, 379–381, 384, 385, 327/387, 389, 391, 427, 434; 326/26, 27, 326/82–87
See application file for complete search history.

(56) References Cited

U.S. PATENT DOCUMENTS 6,265,915 B1 * 7/2001 Rider et al. .................. 327/112
7,434,130 B2 10/2008 Huisman et al.

FOREIGN PATENT DOCUMENTS

KR 10-2004-0091580 A 10/2004
KR 10-084340 B1 6/2008

OTHER PUBLICATIONS

Xin Zhao, et al. Pre-Bond Testable Low-Power Clock Tree Design for 3D Stacked ICs, 2009 IEEE/ACM International Conference on Computer-Aided Design Digest of Technical Papers, pp. 184-190.
Dean L. Lewis, et al. A Scan-Island Based Design Enabling Pre-bond Testability in Die-Stacked Microprocessors, International Test Conference, 2007, pp. 1-8.

* cited by examiner

*Primary Examiner* — Diana J Cheng
(74) *Attorney, Agent, or Firm* — Lee & Morse, P.C.

(57) ABSTRACT

A switching device includes a first switch disposed between a power source voltage and an intermediate node, the first switch forming a current path on the basis of an input signal, a second switch disposed between the intermediate node and a ground, the second switch forming a current path on the basis of a voltage of the intermediate node, and a transmission gate receiving the input signal, the transmission gate outputting the input signal on the basis of the voltage of the intermediate node.

16 Claims, 10 Drawing Sheets

SWITCHING DEVICE AND SEMICONDUCTOR INTEGRATED CIRCUIT DEVICE INCLUDING THE SAME

BACKGROUND

1. Field

Embodiments relate to a switching device and a semiconductor integrated circuit device including the same.

2. Description of the Related Art

A Three-Dimensional (3D) semiconductor integrated circuit device is a technology in which a plurality of dies is vertically stacked and is included in one semiconductor package. Such a 3D semiconductor integrated circuit device reduces the occupied area of a semiconductor package and is suitable for, e.g., increasing the capacity of a memory.

SUMMARY

An embodiment is directed to a switching device, including a first switch disposed between a power source voltage and an intermediate node, the first switch forming a current path on the basis of an input signal, a second switch disposed between the intermediate node and a ground, the second switch forming a current path on the basis of a voltage of the intermediate node, and a transmission gate receiving the input signal, the transmission gate outputting the input signal on the basis of the voltage of the intermediate node.

When the input signal is an active state, the first switch may be turned on and charge the intermediate node with the power source voltage, and the second switch may be turned off on the basis of the charged voltage of the intermediate node.

When the input signal is an active state, the transmission gate may form a conductive path for outputting the input signal on the basis of the charged voltage of the intermediate node.

When the input signal is an inactive state, the first switch may be turned off and the second switch may be turned on, thereby discharging the intermediate node to a ground voltage.

When the input signal is an inactive state, the transmission gate may prevent the input signal from being outputted on the basis of the discharged voltage of the intermediate node.

The first switch may be a PMOS transistor and the second switch may be an NMOS transistor. The switching device may further include a first inverter connected to a gate of the PMOS transistor, a second inverter disposed between the intermediate node and a gate of the NMOS transistor, and a third inverter disposed between the second inverter and the transmission gate.

Another embodiment is directed to a semiconductor integrated circuit device, including first and second networks respectively including at least one clocked element, and a redundant network disposed between the first and second networks, the redundant network providing a clock signal to the first and second networks, the redundant network providing the clock signal to the first and second networks on the basis of whether the clock signal is activated.

When the clock signal is in an active state, the redundant network may form a conductive path for providing the activated clock signal to the first and second networks.

The redundant network may include a first switch disposed between a power source voltage and an intermediate node, the first switch forming a current path on the basis of the clock signal, a second switch disposed between the intermediate node and a ground, the second switch forming a current path on the basis of a voltage of the intermediate node, and a transmission gate receiving the clock signal, the transmission gate providing the clock signal to the first network or the second network on the basis of the voltage of the intermediate node.

The first switch may be a PMOS transistor and the second switch may be an NMOS transistor. The semiconductor integrated circuit device may further include a first inverter connected to a gate of the PMOS transistor, a second inverter disposed between the intermediate node and a gate of the NMOS transistor, and a third inverter disposed between the second inverter and the transmission gate.

When the clock signal is an active state, the PMOS transistor may be turned on and charge the intermediate node, and the NMOS transistor may be turned off on the basis of the charged voltage of the intermediate node.

One end of the transmission gate may be connected to the second inverter, another end of the transmission gate may be connected to the third inverter, and the transmission gate may form a conductive path for outputting the clock signal when the clock signal is an active state.

When the clock signal is an inactive state, the PMOS transistor may be turned off and the NMOS transistor may be turned on, thereby discharging the intermediate node.

The redundant network may electrically connect the first and second networks on the basis of the clock signal while a pre-bond test is being performed.

The redundant network may transfer the clock signal to the electrically-connected first and second networks while the pre-bond test is being performed.

Another embodiment is directed to a switching device connected between an input node and an output node and forming a current path, the switching device including a transmission gate transferring an input signal from the input node to the output node or preventing the input signal from being transferred to the output node, a first switch forming a current path for charging an intermediate node, when the input signal is in an active state, and a second switch forming a current path for discharging the intermediate node, when the input signal is in an inactive state. The transmission gate may transfer the active state input signal to the output node and prevent the inactive state input signal from being transferred to the output node, on the basis of a voltage of the intermediate node.

The first switch may be disposed between a power source voltage and the intermediate node, the first switch forming a current path on the basis of a voltage of the input node, and the second switch may be disposed between the intermediate node and a ground, the second switch forming a current path on the basis of a voltage of the intermediate node.

The first switch may be a PMOS transistor and the second switch may be an NMOS transistor. The switching device may further include a first inverter connected to a gate of the PMOS transistor, a second inverter disposed between the intermediate node and a gate of the NMOS transistor, and a third inverter disposed between the second inverter and the transmission gate.

Another embodiment is directed to a semiconductor device having a plurality of dies integrated therein, the device including a first die, the first die including a first network and a second network, the first and second networks each being connected to a common redundant network that receives a test clock signal, the redundant network having a connection state that is responsive to an activation state of the test clock signal such that the redundant network provides the test clock signal to the first and second networks when the test clock signal is active and electrically isolates the first network from the second network when the test clock signal is inactive, and a second die, the second die including a third network and a fourth network, the third network and the first network each being connected to a first clock signal line, and the fourth network and the second network each being connected to a second clock signal line, isolation of the first network from the second network by the inactive test clock signal preventing the first clock signal line from being connected to the second clock signal line through the redundant network.

The first die and the second die may be stacked one above the other, and the first and second clock signal lines may be routed through respective through silicon vias.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
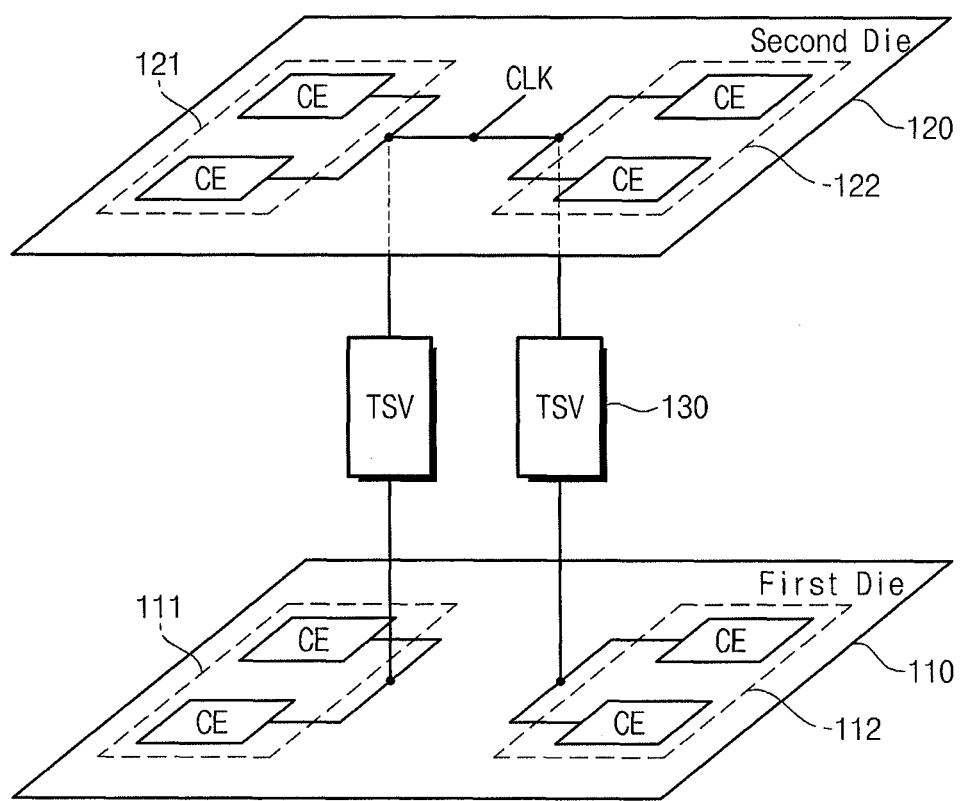
FIG. 1 illustrates a block diagram of a Three-Dimensional (3D) semiconductor integrated circuit device.

Korean Patent Application No. 10-2010-0026429, filed on Mar. 24, 2010, in the Korean Intellectual Property Office, and entitled: "Switching Device and Semiconductor Integrated Circuit Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a block diagram of a Three-Dimensional (3D) semiconductor integrated circuit device. In FIG. 1, as an example of a 3D semiconductor integrated circuit device, a 3D semiconductor integrated circuit device 10 including two stacked dies is illustrated. In FIG. 1, the 3D semiconductor integrated circuit device 10 includes a first die 110 and a second die 120.

An integrated circuit may be formed at the upper surface of the first die 110. For conciseness, it is assumed that first and second sub-networks 111 and 112 are formed at the upper surface of the first die 110, and the first and second sub-networks 111 and 112 are electrically disconnected. Moreover, it is assumed that the each of first and second sub-networks 111 and 112 includes a plurality of clocked elements CE.

Herein, the clocked element CE denotes an element that performs a certain operation in response to a clock signal. For example, the clocked element CE may be a memory performing a memory function, or a logic element performing a logic circuit function. As another example, the clocked element CE may be driven by the clock signal, and may include elements that of large scale and/or integration, and configure a system through a 3D structure.

An integrated circuit may be formed at the upper surface of the second die 120. For conciseness, it is assumed that third and fourth sub-networks 121 and 122 are formed at the upper surface of the second die 120. Moreover, it is assumed that each of third and fourth sub-networks 121 and 122 includes a plurality of clocked elements CE, like the first and second sub-networks 111 and 112.

As shown in FIG. 1, the second die 120 may be stacked on the upper portion of the first die 110. The first and second dies 110 and 120 having a vertically-stacked structure configure the 3D semiconductor integrated circuit device 10. In this case, the first and second dies 110 and 120 are connected by a through electrode. For example, in FIG. 1, the first and second dies 110 and 120 may be connected through a Through Silicon Via (TSV) 130.

In order to increase the reliability of 3D semiconductor integrated circuit devices, the normal operations of the 3D semiconductor integrated circuit devices are tested. However, if the normal operation of a 3D semiconductor integrated circuit device is tested without a test of each die, then there is a limitation in that the entire 3D semiconductor integrated circuit device may be discarded because of a failure of one die.

In order to determine the normal operation of the 3D semiconductor integrated circuit device 10, electrical testing may be performed, including performing a pre-bond test and a post-bond test. Herein, the pre-bond test is an electric test that is performed before the TSV 130 is formed. That is, the pre-bond test is an electric test for testing the normal operation of each die. The post-bond test is an electric test that is performed after the TSV 130 is formed. That is, the post-bond test is an electric test for testing the normal operation of dies that are connected through the TSV 130.

In 3D semiconductor integrated circuit devices, the pre-bond test and the post-bond test may be performed for increasing reliability. For example, referring to FIG. 1, the pre-bond test for the first and second dies 110 and 120 may be performed, and thereafter the post-bond test for the 3D semiconductor integrated circuit device 10 electrically connected to the first and second dies 110 and 120 may be performed.

A wiring structure may be provided in the first die 110 for performing the pre-bond test for the first die 110. In further detail, a clock signal is applied to the first and second sub-networks 111 and 112 for performing the pre-bond test. The first and second sub-networks 111 and 112 of the die 110 are electrically disconnected. In FIG. 1, a wiring structure for applying the clock signal to the first and second sub-networks 111 and 112 is not formed in the first die 110. Therefore, a certain wiring structure is provided in the first die 110 to perform the pre-bond test for the first die 110. For this, a redundant clock network for performing the pre-bond test is formed in the first die 110. This will be described below in more detail.

In FIG. 1, it is illustrated that the TSVs 130 are coupled between the first and second dies 110 and 120. This should be understood as an example. For example, a TSV buffer may be disposed between the second die 120 and the TSV 130. The TSV buffer may be used for maintaining clock characteristics before and after the connection of the TSV 130. For example, the TSV buffer may allow two clock signals CLK to have the same skew, wherein one of the clocks signals is applied while the pre-bond test is being performed, and the other is applied while the post-bond test is being performed.

In FIG. 1, it is illustrated that each die has two sub-networks and each sub-network has two clocked elements CE. This should be understood as an example. For example, the each die may include at least one sub-network. Moreover, each sub-network may include at least one clocked element CE. In this case, the clocked elements CE may form various tree structures such as an H tree structure and an X tree structure.

Figure 2:
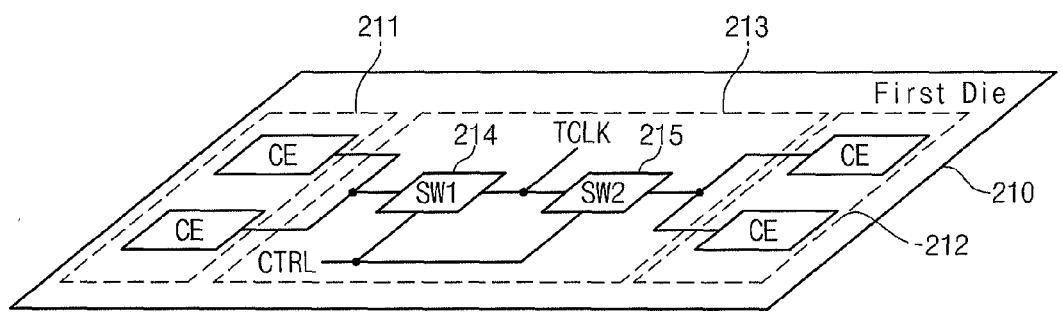
FIG. 2 illustrates a block diagram of a redundant clock network for performing a pre-bond test.

FIG. 2 illustrates a block diagram of a redundant clock network for performing a pre-bond test. For conciseness, it is assumed that two sub-networks are formed in a first die 210 of FIG. 2. In FIG. 2, first and second sub-networks 211 and 212 and a redundant clock network 213 are formed in the first die 210.

In FIG. 2, the redundant clock network 213 includes a first switch (SW1) 214 and a second switch (SW2) 215. Also, the redundant clock network 213 includes a wiring structure for applying a control signal CTRL, and a wiring structure for applying a test clock signal TCLK. The redundant clock network 213 electrically connects or disconnects the first and second sub-networks 211 and 212.

When a pre-bond test is performed, the redundant clock network 213 electrically connects the first and second sub-networks 211 and 213. The redundant clock network 213 transfers the test clock signal TCLK to the electrically-connected first and second sub-networks 211 and 212. In this case, for example, the test clock signal TCLK may be a clock signal inputted from the outside.

In further detail, when the pre-bond test is performed, the first and second switches 214 and 215 are turned on in response to the control signal CTRL. At this point, therefore, the first and second sub-networks 211 and 212 are electrically connected. Also, the test clock signal TCLK is transferred to the first and second sub-networks 211 and 212 through the first and second switches 214 and 215. Accordingly, the normal operations of the clocked elements CE of the first and second sub-networks 211 and 212 may be tested.

The pre-bond test is performed, and then the redundant clock network 213 disconnects the first and second sub-networks 211 and 212. Even if the test clock signal TCLK is active and continuously applied from the outside, the redundant clock network 213 disconnects the test clock signal TCLK in response to the control signal CTRL.

In further detail, the pre-bond test is performed, and then the first and second switches 214 and 215 are turned off in response to the control signal CTRL. At this point, the first and second sub-networks 211 and 212 are electrically disconnected by the first and second switches 214 and 215. Also, the first and second switches 214 and 215 stop the test clock signal TCLK from being transferred to the first and second sub-networks 211 and 212.

When the first die 210 is determined to be normal as the result of the pre-bond test, i.e., it satisfies the pre-bond test, a second die may be stacked on the first die. In this case, the first and second dies may be connected by a TSV. Subsequently, a post-bond test may be performed for determining whether clocked elements CE in a stack structure operate normally. This will be described below in more detail with reference to FIG. 3.

Figure 3:
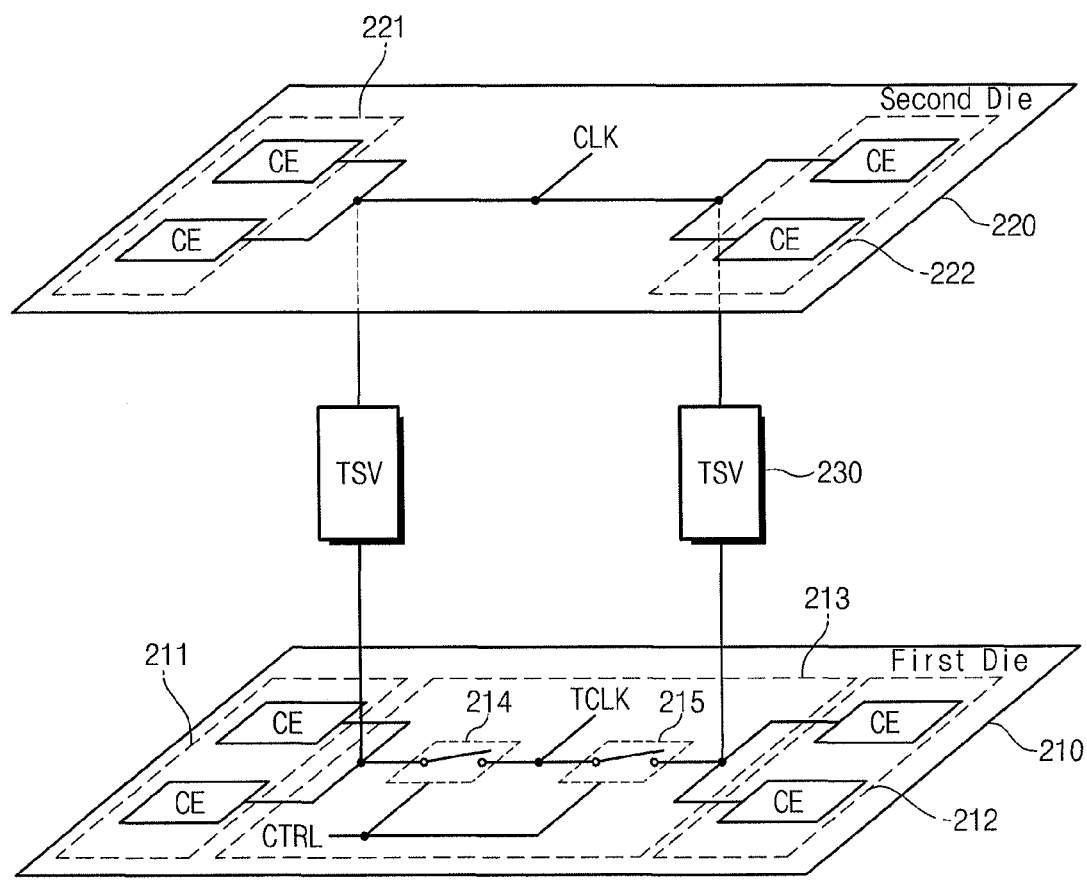
FIG. 3 illustrates a block diagram for describing a post-bond test of a 3D semiconductor integrated circuit device including a redundant clock network structure of FIG. 2.

FIG. 3 illustrates a block diagram for describing a post-bond test of a 3D semiconductor integrated circuit device 20 including the redundant clock network structure of FIG. 2. For conciseness, it is assumed that the first die 210 of FIG. 3 is structurally similar to the first die 210 of FIG. 2. Also, it is assumed that a second die 220 of FIG. 3 has a structure similar to that of the first die 120 of FIG. 1.

In FIG. 3, the 3D semiconductor integrated circuit device 20 includes the first and second dies 210 and 220. The second die 220 is stacked on the upper portion of the first die 210 to form a 3D semiconductor integrated circuit device. In FIG. 3, the first and second dies 210 and 220 are connected through a TSV 230.

When a post-bond test is performed, a clock signal CLK is transferred to first and second sub-networks 221 and 222 of the second die 220. Therefore, the normal operations of the clocked elements CE of the second die 220 may be determined.

Moreover, when the post-bond test is performed, the clock signal CLK is transferred to the first die 210 through the TSV 230. In this case, first and second switches 214 and 215 are turned off. That is, the first and second sub-networks 211 and 212 are electrically disconnected by the first and second switches 214 and 215. Therefore, the clock signal CLK is transferred to the electrically-disconnected first and second sub-networks 211 and 212 of the first die 210. Accordingly, the normal operations of the clocked elements CE of the first die 210 are determined. As a result, the normal operation of the 3D semiconductor integrated circuit device 220 is determined.

Further to the above, and referring to FIGS. 2 and 3, a wiring structure for applying the control signal CTRL of a redundant network structure 213 is used for dividing the pre-bond test and the post-bond test. That is, the wiring structure for applying the control signal CTRL is used for turning on the first and second switches 214 and 215 in the pre-bond test. Also, the wiring structure for applying the control signal CTRL is used for turning off the first and second switches 214 and 215 after the pre-bond test.

In FIG. 3, it is illustrated that the TSVs 230 are coupled between the first and second dies 210 and 220. This should be understood as an example. For example, a TSV buffer may be disposed between the second die 220 and the TSV 230.

Hereinafter, a redundant network structure that does not include the wiring structure for applying the control signal CTRL will be described in detail with reference to FIGS. 4 to 8.

Figure 4:
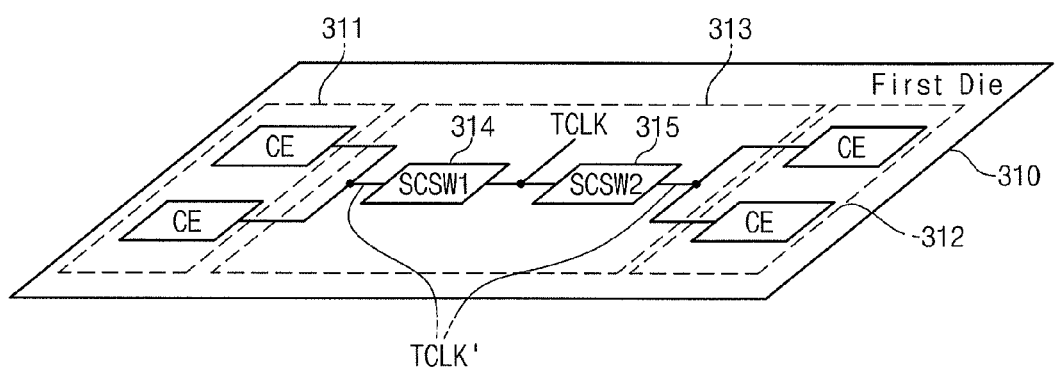
FIG. 4 illustrates a block diagram of a redundant clock network for performing a pre-bond test according to an embodiment.

FIG. 4 illustrates a block diagram of a redundant clock network for performing a pre-bond test according to an embodiment. The redundant clock network according to the present embodiment provides a switching device which determines the normal operation of each die.

For conciseness, it is assumed that a sub-network structure similar to that of the first die 110 of FIG. 1 is formed in a first die 310 of FIG. 4. In FIG. 4, first and second sub-networks 311 and 312 and a redundant clock network 313 are formed in the first die 310.

In FIG. 4, the redundant clock network 313 includes a first self-controlled switch (SCSW) 314 and a second self-controlled switch (SCSW) 315. Also, the redundant clock network 313 includes a wiring structure for applying a test clock signal TCLK, and a wiring structure for connecting the first and second sub-networks 311 and 312.

In contrast to the redundant clock network 213 of FIG. 2, the redundant clock network 313 of FIG. 4 does not include a wiring structure for applying a control signal CTRL. That is, the redundant clock network 313 of FIG. 4 may operate without the control signal CTRL.

For example, when the pre-bond test is performed, the redundant clock network 313 receives an activated test clock signal TCLK, i.e., the test clock signal TCLK is in an active state. With the test clock signal TCLK in the active state, the first and second self-controlled switches 314 and 315 are automatically turned on, without using the control signal CTRL. Therefore, the first and second sub-networks 311 and 312 are electrically connected by the first and second self-controlled switches 314 and 315.

As another example, after the pre-bond test, the redundant clock network 313 receives a deactivated test clock signal TCLK, i.e., the test clock signal TCLK is in an inactive state. With the test clock signal TCLK in the inactive state, the first and second self-controlled switches 314 and 315 are automatically turned off, without using the control signal CTRL. Therefore, the first and second sub-networks 311 and 312 are electrically disconnected by the first and second self-controlled switches 314 and 315.

As described above, the redundant clock network 313 of FIG. 4 does not include the wiring structure for applying the control signal CTRL, unlike the redundant clock network 213 of FIG. 2. The self-controlled switch of the redundant clock network 313 of FIG. 4 will be described below in more detail with reference to FIG. 5.

Figure 5:
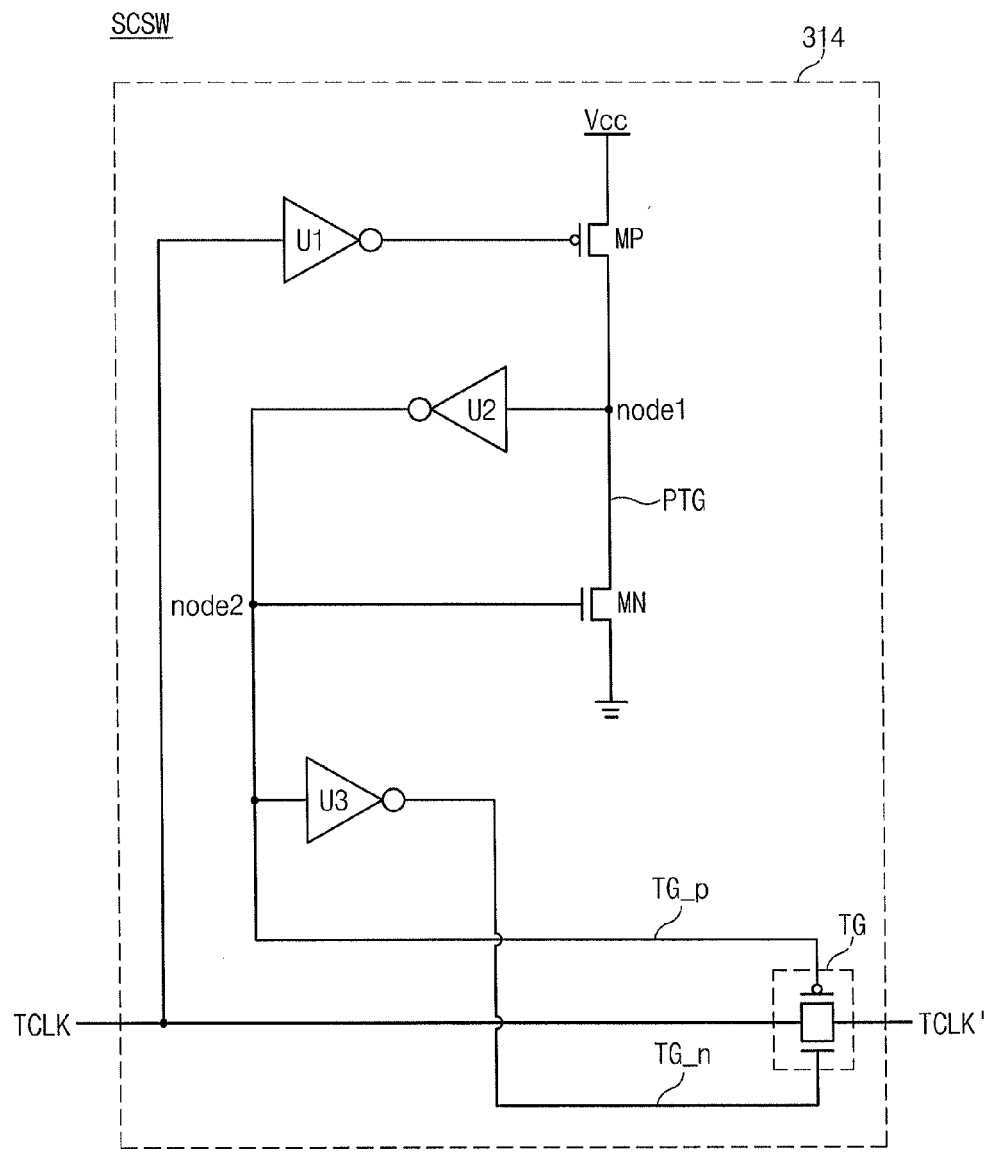
FIG. 5 illustrates a circuit diagram of a structure of a self-controlled switch of FIG. 4.

FIG. 5 illustrates a circuit diagram of a structure of the self-controlled switch of FIG. 4. In FIG. 5, for conciseness, only the first self-controlled switch 314 is illustrated.

In FIG. 5, the first self-controlled switch 314 includes a PMOS transistor MP, an NMOS transistor MN, a transmission gate TG, and a plurality of inverters U1 to U3.

The first self-controlled switch 314 receives a test clock signal TCLK. When the test clock signal TCLK is in the active state, it cycles. When the test clock signal TCLK is in the inactive state, it stops cycling.

In FIG. 5, the test clock signal TCLK is transferred to a first inverter U1. The first inverter U1 inverts the test clock signal TCL. The inverted test clock signal is transferred to the gate of the PMOS transistor MP.

The PMOS transistor MP forms a current path in response to the inverted test clock signal. For example, when the inverted test clock signal has a logical low level, the PMOS transistor MP may be turned on. At this point, a power source voltage Vcc may be transferred to a first node node1 through the PMOS transistor MP. As an example, an electric charge provided by the power source voltage Vcc may be charged in a parasitic capacitor that exists in the first node node1. The voltage of the first node node1 may be referred to as a pre-transmission gate signal PTG. When the inverted test clock signal has a logical high level, the PMOS transistor MP may be turned off.

In FIG. 5, a second inverter U2 is disposed between the first node node1 and a second node node2. The second inverter U2 inverts the voltage of the first node node1 and transfers the inverted voltage to the second node node2. The voltage transferred to the second node node2 is transferred to the gate of the NMOS transistor MN. The voltage of the second node node2 may be referred to as a p transmission gate signal TG_p.

The NMOS transistor MN forms a current path in response to the voltage of the second node node2. For example, when the voltage of the second node node2 has a logical high level, the NMOS transistor MN may be turned on, and, as such, the voltage of the first node node1 may be discharged through a ground. When the voltage of the second node node2 has a logical low level, the NMOS transistor MN may be turned off.

In FIG. 5, a third inverter U3 is disposed between the second inverter U2 and the transmission gate TG. The third inverter U3 inverts the voltage of the second node node2. The voltage of the second node node2 that is inverted by the third inverter U3 may be referred to as an n transmission gate signal TG_n.

In FIG. 5, the transmission gate TG is configured with a PMOS transistor and an NMOS transistor. The gate of the PMOS transistor of the transmission gate TG receives the p transmission gate signal TG_p. The gate of the NMOS transistor of the transmission gate TG receives the n transmission gate signal TG_n.

The transmission gate TG forms a current path in response to the p transmission gate signal TG_p and the n transmission gate signal TG_n. For example, when the p transmission gate signal TG_p is a logical low level and the n transmission gate signal TG_n has a logical high level, the transmission gate TG is turned on. That is, referring to FIG. 4, a conductive path is formed between the wiring structure for applying the test clock signal TCLK and the first sub-network 311. Therefore, the transmission gate TG transfers the received test clock signal TCLK to the first sub-network 311 as a test output clock signal TCLK'.

When the p transmission gate signal TG_p is a logical high level and the n transmission gate signal TG_n has a logical low level, the transmission gate TG is turned off. Therefore, referring to FIG. 4, the wiring structure for applying the test clock signal TCLK and the first sub-network 311 are electrically disconnected from one another.

As described above, the first self-controlled switch 314 forms a conductive path in response to the p transmission gate signal TG_p and the n transmission gate signal TG_n. Also, the second self-controlled switch 315 has the same structure as that of the first self-controlled switch 314. Therefore, the second self-controlled switch 315 also forms a conductive path in response to the p transmission gate signal TG_p and the n transmission gate signal TG_n.

In this case, the logical levels of the p transmission gate signal TG_p and n transmission gate signal TG_n may be automatically determined by the active/inactive state of the test clock signal TCLK. For example, when the test clock signal TCLK is activated, the p transmission gate signal TG_p may have a logical low level and the n transmission gate signal TG_n may have a logical high level. Therefore, the transmission gate TG is turned on, the first and second sub-networks 311 and 312 may be electrically connected. This will be described below in more detail with reference to FIG. 6.

When the test clock signal TCLK is deactivated, the p transmission gate signal TG_p may have a logical high level and the n transmission gate signal TG_n may have a logical low level. Therefore, the transmission gate TG is turned off, the first and second sub-networks 311 and 312 may be electrically disconnected. This will be described below in more detail with reference to FIG. 7.

Figure 6:
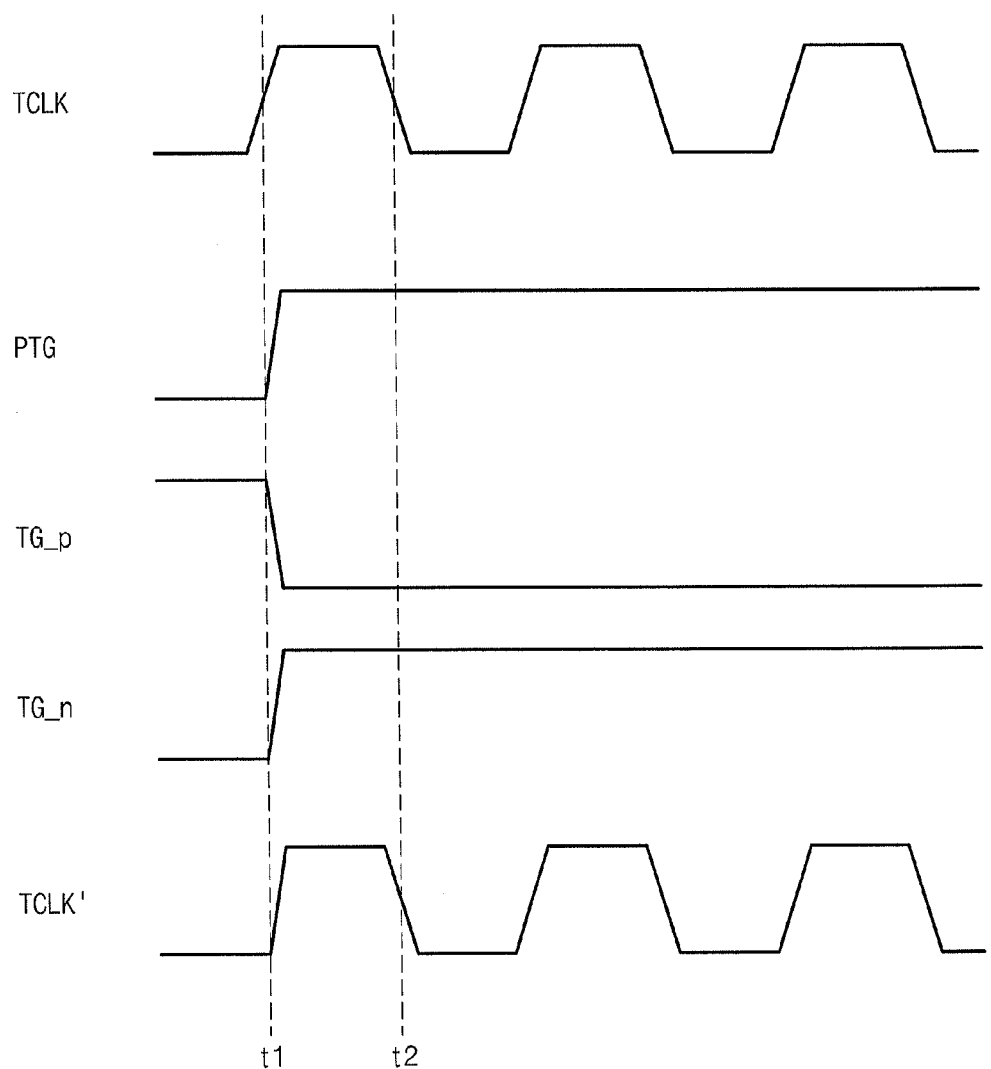
FIG. 6 illustrates a timing diagram for describing an operation of the self-controlled switch of FIG. 5 when a test clock signal is activated.

FIG. 6 illustrates a timing diagram for describing an operation of the self-controlled switch of FIG. 5 when the test clock signal TCLK is activated.

In an initial state, it is assumed that the test clock signal TCLK has a logical low level and the pre-transmission gate signal PTG has a logical low level. The pre-transmission gate signal PTG having a logical low level is inverted by the second inverter U2. Therefore, the p transmission gate signal TG_p has a logical high level. Also, the p transmission gate signal TG_p is inverted by the third inverter U3. Accordingly, the n transmission gate signal TG_n has a logical low level. In the initial state, therefore, since the p transmission gate signal TG_p has a logical high level and the n transmission gate signal TG_n has a logical low level, the transmission gate TG is in a turned-off state.

In FIG. 6, at a first time t1, the test clock signal TCLK transitions from a logical low level to a logical high level. The test clock signal TCLK shifted to the logical high level is inverted by the first inverter U1, which outputs a logical low signal. The logical low signal output by the first inverter U1 is applied to the gate of the PMOS transistor MP. Therefore, the PMOS transistor MP is turned on.

At this point, the power source voltage Vcc is supplied to the first node node1 through the turned-on PMOS transistor MP. That is, the first node node1 is charged with the power source voltage Vcc. Therefore, the pre-transmission gate signal PTG corresponding to the voltage of the first node node1 is shifted from a logical low level to a logical high level in FIG. 6.

The pre-transmission gate signal PTG shifted to the logical high level is inverted by the second inverter U2, which outputs a logical low signal. Therefore, the p transmission gate signal TG_p corresponding to the voltage of the second node node2 is shifted from a logical high level to a logical low level in FIG. 6. The p transmission gate signal TG_p shifted to the logical low level is applied to the gate of the NMOS transistor MN. Therefore, the NMOS transistor MN is turned off. As a result, the pre-transmission gate signal PTG corresponding to the voltage of the first node node1 continuously maintains a logical high state.

The p transmission gate signal TG_p shifted to the logical low level is inverted by the third inverter U3, which outputs a logical high signal. Therefore, the n transmission gate signal TG_n corresponding to the output signal of the third inverter U3 is shifted from a logical low level to a logical high level in FIG. 6.

Since the p transmission gate signal TG_p has the logical low level and the n transmission gate signal TG_n has the logical high level, the transmission gate TG is turned on. Therefore, the test clock signal TCLK is outputted through the transmission gate TG. In this case, the test clock signal TCLK provided to the transmission gate TG and a test output clock signal TCLK' outputted by the transmission gate TG have similar waveform, except for a certain delay time.

At a second time t2 in FIG. 6, the test clock signal TCLK transitions from a logical high level to a logical low level. The test clock signal shifted to the logical low level is inverted by the first inverter U1, which outputs a logical high signal. The logical high signal output by the first inverter U1 is applied to the gate of the PMOS transistor MP. Therefore, the PMOS transistor MP is turned off.

At this point, the first node node1 is floated by the turned-off PMOS transistor MP and the turned-off NMOS transistor MN. When the cycle of the activated test clock signal TCLK is sufficiently short, the voltage discharge of the first node node1 from a leakage current may be ignored. In this case, the pre-transmission gate signal PTG corresponding to the voltage of the first node node1 maintains a logical high level. Therefore, the p transmission gate signal TG_p maintains a logical low state, and the n transmission gate signal TG_n maintains a logical high state. As a result, the transmission gate TG continuously maintains the turned-on state.

As described above, when the activated test clock signal TCLK is provided, the transmission gate TG is turned on. Also, when the cycle of the activated test clock signal TCLK is sufficiently short that the leakage current of the first node node1 may be ignored, the transmission gate TG maintains the turned-on state.

Therefore, when the first self-controlled switch 314 receives the activated test clock signal TCLK, it is automatically turned on, thereby forming a conductive path. That is, the first self-controlled switch 314 receives the activated test clock signal TCLK from the outside, and provides the activated test output clock signal TCLK' to the first sub-network 311 (see FIG. 4). Likewise, the second self-controlled switch 315 receives the activated test clock signal TCLK from the outside, and provides the activated test output clock signal TCLK' to the second sub-network 312 (see FIG. 4). As a result, for example, when the pre-bond test is performed, the first and second self-controlled switches 314 and 315 provide the activated test clock signal TCLK to the first and second sub-networks 311 and 312, respectively.

Figure 7:
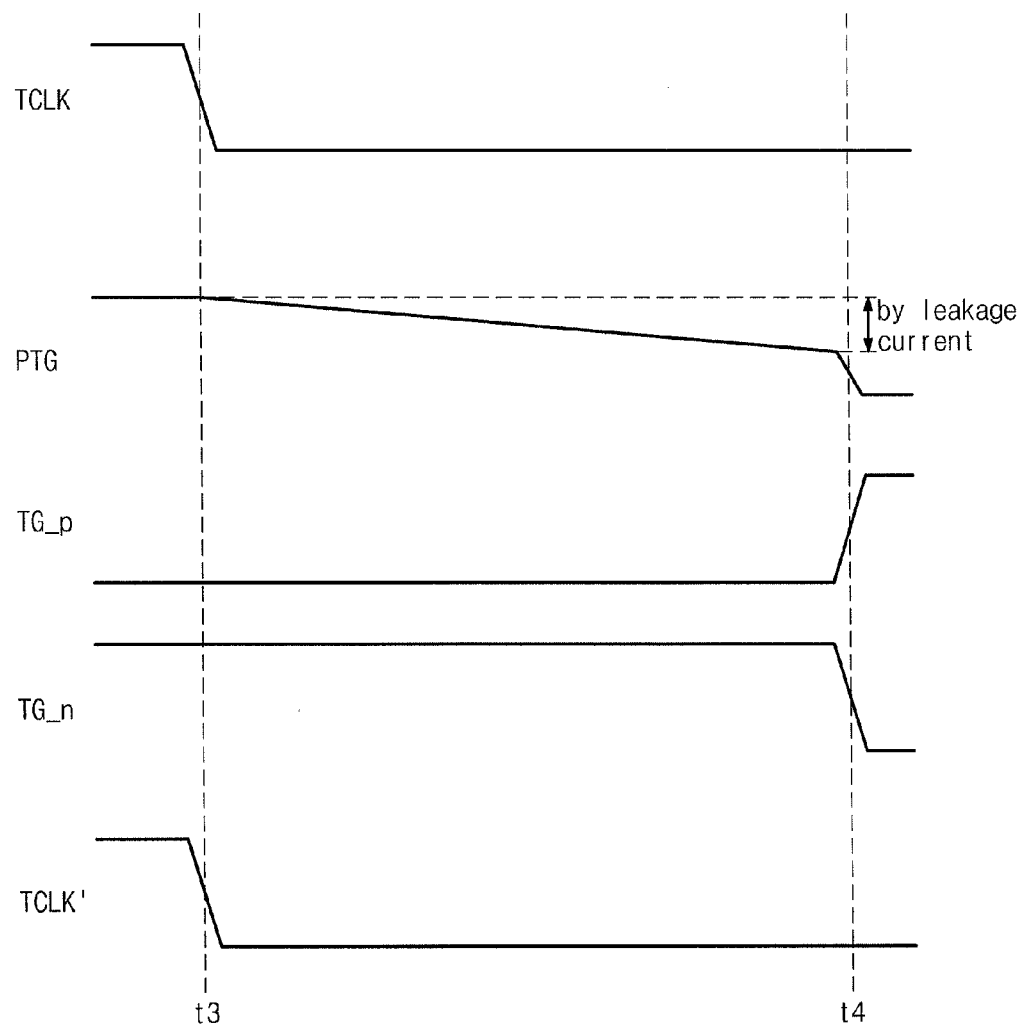
FIG. 7 illustrates a timing diagram for describing an operation of the self-controlled switch of FIG. 5 when the test clock signal is deactivated.

FIG. 7 illustrates a timing diagram for describing an operation of the self-controlled switch of FIG. 5 when the test clock signal TCLK is deactivated.

In an initial state, it is assumed that the test clock signal TCLK has a logical high level and the pre-transmission gate signal PTG has a logical high level. It is assumed that the activated test clock signal TCLK is provided and thus the transmission gate TG continuously maintains a turned-on state. In this case, the pre-transmission gate signal PTG corresponding to the voltage of the first node node1 may have a logical high level. Moreover, the p transmission gate signal TG_p has a logical low level and the n transmission gate signal TG_n has a logical high level.

In FIG. 7, at a third time t3, the test clock signal TCLK transitions from the logical high level to a logical low level. The test clock signal shifted to the logical low level is inverted by the first inverter U1, which outputs a logical high signal. The logical high signal output by the first inverter U1 is applied to the gate of the PMOS transistor MP. Therefore, the PMOS transistor MP is turned off.

At this point, the first node node1 is floated by the turned-off PMOS transistor MP and the turned-off NMOS transistor MN. Since the test clock signal TCLK is deactivated, or continuously in an inactive state, the voltage of the first node node1 may be slowly discharged by a leakage current. Therefore, the pre-transmission gate signal PTG corresponding to the voltage of the first node node1 may be slowly shifted from a logical high level toward a logical low level, as shown in FIG. 7.

When the voltage level of the pre-transmission gate signal PTG decreases to less than a certain level, the NMOS transistor MN may be turned on. At a fourth time t4 in FIG. 7, when the NMOS transistor MN is turned on, the pre-transmission gate signal PTG corresponding to the voltage of the first node node1 may be discharged through a ground. Therefore, the pre-transmission gate signal PTG may be quickly shifted to a logical low level.

When the voltage level of the pre-transmission gate signal PTG decreases to less than the certain level, the p transmission gate signal TG_p may be quickly shifted from a logical low level to a logical high level. Also, the n transmission gate signal TG_n may be quickly shifted from a logical high level to a logical low level. Therefore, the transmission gate TG may be turned off.

Moreover, since the deactivated test clock signal TCLK continuously has a logical low level, the p transmission gate signal TG_p and the n transmission gate signal TG_n may have a logical high level and a logical low level, respectively. Therefore, the transmission gate TG may maintain a turned-off state.

An amount of time taken while the transmission gate TG is turned off may be referred to a turn-off time. Referring to FIG. 7, for example, a time from the third time t3 to the fourth time t4 may be called the turn-off time. The turn-off time may be adjusted by controlling the sizes of the PMOS transistor MP and NMOS transistor MN. As an example, when the size of the NMOS transistor MN is greater than that of the PMOS transistor MP, the turn-off time may be shortened.

As described above, when the deactivated test clock signal TCLK is continuously provided, the transmission gate TG is automatically turned off after a certain time elapses. Also, when the test clock signal TCLK is continuously in an inactive state, the transmission gate TG maintains a turn-off state. Therefore, when the first self-controlled switch 314 of FIG. 5 receives the deactivated test clock signal TCLK, it is automatically turned off after a certain time elapses.

Likewise, when the second self-controlled switch 315 of FIG. 5 receives the deactivated test clock signal TCLK, it is automatically turned off after a certain time elapses. Therefore, when the test clock signal TCLK is deactivated, the first and second self-controlled switches 314 and 315 electrically disconnect the first and second sub-networks 311 and 312. As a result, for example, when the post-bond test is performed, the first and second self-controlled switches 314 and 315 automatically disconnect the first and second sub-networks 311 and 312.

Figure 8:
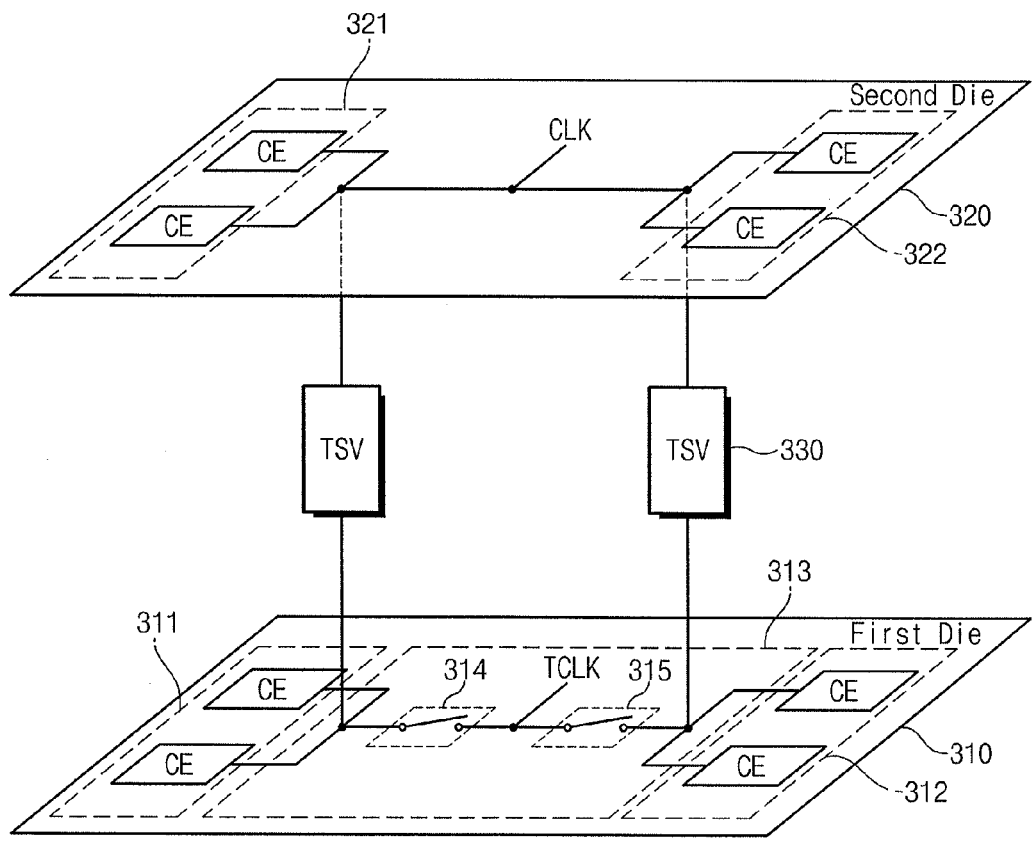
FIG. 8 illustrates a block diagram for describing a post-bond test of a 3D semiconductor integrated circuit device including a redundant clock network structure of FIG. 4.

FIG. 8 illustrates a block diagram for describing a post-bond test of a 3D semiconductor integrated circuit device including the redundant clock network structure of FIG. 4. For conciseness, it is assumed that a first die 310 of FIG. 8 is structurally similar to the first die 310 of FIG. 4. Also, it is assumed that a second die 320 of FIG. 8 has a structure similar to that of the first die 120 of FIG. 1.

When a post-bond test is performed, a clock signal CLK is transferred to first and second sub-networks 321 and 322 of the second die 320. Therefore, the normal operations of the clocked elements CE of the second die 320 are determined. Moreover, when the post-bond test is performed, the clock signal CLK is transferred to the first die 310 through a TSV 330.

When the post-bond test is performed, first and second self-controlled switches 314 and 315 maintain a turn-off state. For example, when an external test clock signal TCLK is in an inactive state, the first and second self-controlled switches 314 and 315 may maintain the turned-off state. Further, even when the test clock signal TCLK of the inactive state is provided from the outside for longer than a turn-off time and then removed, and the first and second self-controlled switches 314 and 315 may maintain the turned-off state. Therefore, first and second sub-networks 311 and 312 are electrically disconnected by the first and second self-controlled switches 314 and 315. In this case, the clock signal CLK is transferred to the electrically-disconnected first and second sub-networks 311 and 312 of the first die 310. As a result, the normal operation of a 3D semiconductor integrated circuit device 30 may be determined.

As described above, according to embodiments, clocked elements CE may be electrically connected or disconnected by a switching device using one or more self-controlled switches. Accordingly, the normal operation of each die can be tested before the 3D semiconductor integrated circuit device is provided. The clocked elements CE may form part of a 3D memory device, which may be implemented in a memory system and applied to various products. The memory system may be implemented in an electronic device such as a personal computer, a digital camera, a camcorder, a mobile phone, an MP3, a PMP, a PSP, and a PDA, in a storage device such as a memory card (e.g., SD, MMC, and the like), a USB memory, and a solid state drive (SSD), etc.

As described above, a self-controlled switch SCSW according to an embodiment may be used for the pre-bond test of a 3D semiconductor integrated circuit device. In other words, the self-controlled switch SCSW may be used as a redundant network for performing the pre-bond test. This should be understood as an example, and the inventive concept is not limited thereto.

In other implementations, a self-controlled switch SCSW according to an embodiment may be variously applied to and used for other functions, in addition to 3D semiconductor circuit devices. For example, the self-controlled switch SCSW according to an embodiment may replace a switch that selectively forms a conductive path according to whether an input signal is activated. This will be described below in more detail with reference to FIGS. 9A and 9B. As another example, the self-controlled switch SCSW according to an embodiment may be used in a multiplexer that selects an activated input signal from among input signals. This will be described below in more detail with reference to FIGS. 10A and 10B.

Figure 9A:
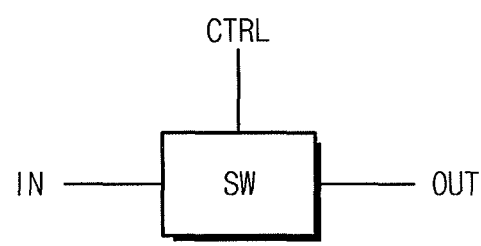
FIG. 9A illustrates a block diagram of a switch that forms a conductive path in response to a control signal.

FIG. 9A illustrates a block diagram of a switch which forms a conductive path in response to a control signal.

Referring to FIG. 9A, a switch SW forms a conductive path in response to a control signal CTRL. The switch SW electrically connects a conductive line of the input signal IN and a conductive line of an output signal OUT when the input signal IN is active, and the switch SW electrically disconnects the conductive line of the input signal IN and the conductive line of the output signal OUT when the input signal IN is deactivated. More particularly, the switch SW is turned on in response to the control signal CTRL when an input signal IN is activated, and the switch SW is turned on in response to the control signal CTRL even when an input signal IN is inactive.

Figure 9B:
FIG. 9B illustrates a block diagram of a switch that forms a conductive path according to whether an input signal is activated, according to an embodiment.

According to an embodiment, the switch SW of FIG. 9A may be replaced by a self-controlled switch SCSW. For example, the switch SW of FIG. 9A may be replaced by a self-controlled switch SCSW that is illustrated in FIG. 9B. As an example, the self-controlled switch SCSW of FIG. 9B may have the same structure as that of the first self-controlled switch 314 of FIG. 5.

Unlike the switch SW of FIG. 9A, the self-controlled switch SCSW of FIG. 9B does not require a circuit for generating a control signal CTRL and a wiring structure for transferring the control signal CTRL. Accordingly, by replacing the switch SW of FIG. 9A with the self-controlled switch SCSW of FIG. 9B, a degree of integration may be enhanced for a circuit substrate to which the switch is provided.

Figure 10A:
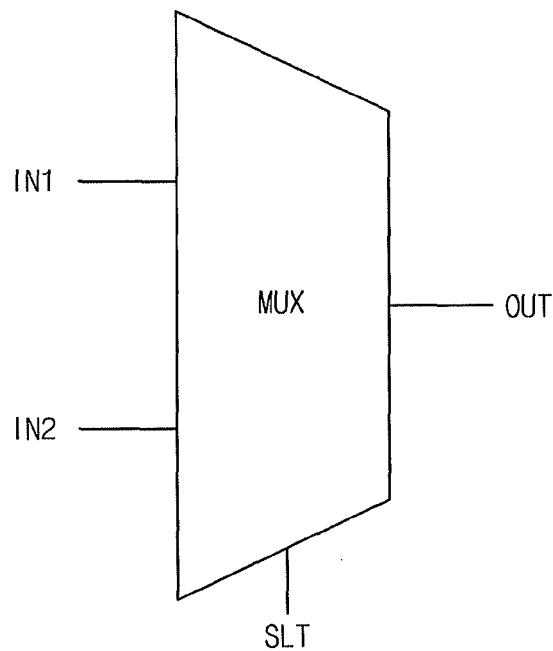
FIG. 10A illustrates a block diagram of a multiplexer that selects an activated input signal from among input signals in response to a control signal.

FIG. 10A illustrates a block diagram of a multiplexer MUX that selects an activated input signal from among input signals. Referring to FIG. 10A, the multiplexer MUX selects an activated input signal from among first and second input signals IN1 and IN2 in response to a selection signal SLT.

According to an embodiment, the multiplexer MUX of FIG. 10A may be implemented with the self-controlled switch SCSW. For example, the multiplexer of FIG. 10A may be implemented as a multiplexer including a self-controlled switch SCSW that is illustrated in FIG. 10B.

Figure 10B:
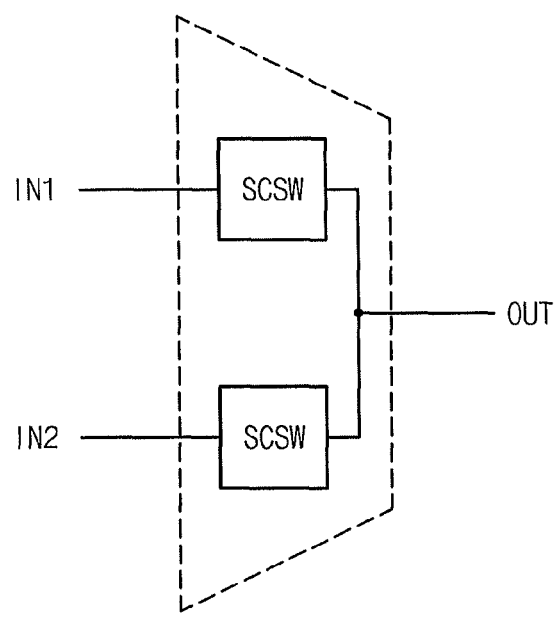
FIG. 10B illustrates a block diagram of a multiplexer that selects an activated input signal from among input signals, according to an embodiment.

Referring to FIG. 10B, for example, when the first input signal IN1 is in an active state and the second input signal IN2 is in an inactive state, a first self-controlled switch SCSW1 is turned on and a second self-controlled switch SCSW2 may be turned off. Therefore, the multiplexer of FIG. 10B may select and output the activated first input signal IN1.

Unlike the multiplexer of FIG. 10A, the multiplexer of FIG. 10B does not require a circuit for generating a selection signal SLT and a wiring structure for transferring the selection signal SLT. Accordingly, by implementing the multiplexer with the multiplexer of FIG. 10B, a degree of integration may be enhanced for a circuit substrate to which the multiplexer is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A switching device, comprising:
a first switch disposed between a power source voltage and an intermediate node, the first switch forming a current path on the basis of an input signal;
a second switch disposed between the intermediate node and a ground, the second switch forming a current path on the basis of a voltage of the intermediate node; and
a transmission gate receiving the input signal, the transmission gate outputting the input signal on the basis of the voltage of the intermediate node, wherein:
when the input signal is an active state,
the first switch is turned on and charges the intermediate node with the power source voltage, and
the second switch is turned off on the basis of the charged voltage of the intermediate node.

2. The switching device as claimed in claim 1, wherein, when the input signal is an active state, the transmission gate forms a conductive path for outputting the input signal on the basis of the charged voltage of the intermediate node.

3. The switching device as claimed in claim 1, wherein, when the input signal is an inactive state, the first switch is turned off and the second switch is turned on, thereby discharging the intermediate node to a ground voltage.

4. The switching device as claimed in claim 3, wherein, when the input signal is an inactive state, the transmission gate prevents the input signal from being outputted on the basis of the discharged voltage of the intermediate node.

5. The switching device as claimed in claim 1, wherein the first switch is a PMOS transistor and the second switch is an NMOS transistor.

6. The switching device as claimed in claim 5, further comprising:
a first inverter connected to a gate of the PMOS transistor;
a second inverter disposed between the intermediate node and a gate of the NMOS transistor; and
a third inverter disposed between the second inverter and the transmission gate.

7. A semiconductor integrated circuit device, comprising:
first and second networks respectively including at least one clocked element; and a redundant network disposed between the first and second networks, the redundant network providing a clock signal to the first and second networks, the redundant network providing the clock signal to the first and second networks on the basis of whether the clock signal is activated wherein:
the redundant network includes:
a first switch disposed between a power source voltage and an intermediate node, the first switch forming a current path on the basis of the clock signal;
a second switch disposed between the intermediate node and a ground, the second switch forming a current path on the basis of a voltage of the intermediate node; and
a transmission gate receiving the clock signal, the transmission gate providing the clock signal to the first network or the second network on the basis of the voltage of the intermediate node, and
when the clock signal is an active state,
the first switch is turned on and charges the intermediate node with the power source voltage, and
the second switch is turned off on the basis of the charred voltage of the intermediate node.

8. The semiconductor integrated circuit device as claimed in claim 7, wherein, when the clock signal is in an active state, the redundant network forms a conductive path for providing the activated clock signal to the first and second networks.

9. The semiconductor integrated circuit device as claimed in claim 7, wherein the first switch is a PMOS transistor and the second switch is an NMOS transistor.

10. The semiconductor integrated circuit device as claimed in claim 9, further comprising:
a first inverter connected to a gate of the PMOS transistor;
a second inverter disposed between the intermediate node and a gate of the NMOS transistor; and
a third inverter disposed between the second inverter and the transmission gate.

11. The semiconductor integrated circuit device as claimed in claim 10, wherein:
one end of the transmission gate is connected to the second inverter, another end of the transmission gate is connected to the third inverter, and
the transmission gate forms a conductive path for outputting the clock signal when the clock signal is an active state.

12. The semiconductor integrated circuit device as claimed in claim 11, wherein, when the clock signal is an inactive state, the PMOS transistor is turned off and the NMOS transistor is turned on, thereby discharging the intermediate node.

13. The semiconductor integrated circuit device as claimed in claim 7, wherein the redundant network electrically connects the first and second networks on the basis of the clock signal while a pre-bond test is being performed.

14. The semiconductor integrated circuit device as claimed in claim 13, wherein the redundant network transfers the clock signal to the electrically-connected first and second networks while the pre-bond test is being performed.

15. A semiconductor device having a plurality of dies integrated therein, the device comprising:

a first die, the first die including a first network and a second network, the first and second networks each being connected to a common redundant network that receives a test clock signal, the redundant network having a connection state that is responsive to an activation state of the test clock signal such that the redundant network provides the test clock signal to the first and second networks when the test clock signal is active and such that the redundant network electrically isolates the first network from the second network when the test clock signal is inactive; and a second die, the second die including a third network and a fourth network, the third network and the first network each being connected to a first clock signal line, and the fourth network and the second network each being connected to a second clock signal line, the first network being selectively isolated from the second network by the inactive test clock signal thereby preventing the first clock signal line from being connected to the second clock signal line through the redundant network, wherein:

the redundant network includes:

a first switch disposed between a power source voltage and an intermediate node, the first switch forming a current path on the basis of the clock signal;

a second switch disposed between the intermediate node and a ground, the second switch forming a current path on the basis of a voltage of the intermediate node; and a transmission gate receiving the clock signal, the transmission gate providing the clock signal to the first network or the second network on the basis of the voltage of the intermediate node, and when the clock signal is an active state, the first switch is turned on and charges the intermediate node with the power source voltage, and the second switch is turned off on the basis of the charred voltage of the intermediate node.

16. The device as claimed in claim 15, wherein:

the first die and the second die are stacked one above the other, and the first and second clock signal lines are routed through respective through silicon vias.

* * * * *